United States Patent [19]
Amaratunga et al.

[11] Patent Number: 6,091,107
[45] Date of Patent: Jul. 18, 2000

[54] SEMICONDUCTOR DEVICES

[75] Inventors: Gehan A. J. Amaratunga; Florin Udrea, both of Cambridge, United Kingdom

[73] Assignee: Mitel Semiconductor Limited, United Kingdom

[21] Appl. No.: 09/009,230

[22] Filed: Jan. 20, 1998

[30] Foreign Application Priority Data

Jan. 21, 1997 [GB] United Kingdom ............... 9701210

[51] Int. Cl.[7] .................................. H01L 29/76
[52] U.S. Cl. ..................... 257/331; 257/133; 257/141
[58] Field of Search .................... 257/133, 140, 257/141, 331

[56] References Cited

U.S. PATENT DOCUMENTS

| 5,329,142 | 7/1994 | Kitagawa et al. | 257/139 |
|---|---|---|---|
| 5,525,821 | 6/1996 | Harada et al. | 257/331 |
| 5,541,425 | 7/1996 | Nishihara | 257/139 |
| 5,703,384 | 12/1997 | Brunner | 257/139 |

FOREIGN PATENT DOCUMENTS

| 0 407 011 A2 | 1/1991 | European Pat. Off. . |
|---|---|---|
| 0 527 600 A1 | 2/1993 | European Pat. Off. . |
| 0 633 611 A1 | 1/1995 | European Pat. Off. . |
| 0 651 507 A2 | 5/1995 | European Pat. Off. . |
| 0 750 351 A2 | 6/1996 | European Pat. Off. . |
| 195 01 556 A1 | 7/1995 | Germany . |
| 61-298160 | 9/1987 | Japan . |
| 06090002 | 3/1994 | Japan . |

OTHER PUBLICATIONS

Lee, B. H., et al., A Trench–Gate Silicon–On–Insulator Lateral Insulated Gate Bipolar Transistor With the P+ Cathode Well, Japanese Journal of Applied Physics, vol. 34, No. 2B, Part 01, Feb. 1995, pp. 854–859.

*Primary Examiner*—Mark V. Prenty
*Attorney, Agent, or Firm*—Kirschstein, et al.

[57] ABSTRACT

An Insulated Gate Bipolar Transistor has a gate in the form of a trench positioned in a p region in a silicon body. The device operates in a thyristor mode having a virtual emitter which is formed during operation by the generation of an inversion layer at the bottom of the trench within the p region. The device is inherently safe and turns off rapidly as removal of a gate signal collapses the emitter. As the trench gate is situated within the p region, it can withstand high voltages when turned off as the reverse electric field is prevented from reaching the trench gate.

24 Claims, 10 Drawing Sheets though it is non-conductive. As the device is intended to operate at voltages in the range 400 volts to in excess of 5000 volts this is a very important consideration, and in fact permits devices of this invention to be safely and reliably used at high voltages.

SEMICONDUCTOR DEVICES

BACKGROUND OF THE INVENTION

This invention relates to semiconductor devices, and is particularly concerned with trench devices, i.e. devices in which at least one electrode is set into the wall or bottom or forms part of a trench or recess below a major, usually planar, surface of a semiconductor device. The use of trenches is particularly advantageous for devices such as IGBT's (insulated gate bipolar transistors) which are capable of operating at high power and voltage levels. The limit on the upper value of voltage at which such devices can be used is determined by the breakdown voltage of a device. For a device which is capable of operating at high power and at high voltage levels, it is important that the device has a low on-state resistance and turns-off (i.e. current flow through the device ceases) promptly and reliably in response to a turn-off signal. It has proved difficult to produce such a device which reliably meets the conflicting requirements of high current, high voltage operation and a safe, reliable current control characteristic.

SUMMARY OF THE INVENTION

The present invention seeks to provide an improved semiconductor device.

According to a first aspect of this invention, a semiconductor trench device includes an active region having one or more trenches extending from a first surface thereof with at least one p-n junction across which current flow is controllable by a field effect gate electrode disposed at a wall region of the trench and which electrode is operative to produce an inversion layer in a first semiconductor region of a first conductivity type, at least a bottom portion of said trench remote from said first surface being positioned in said first semiconductor region, said first region being adjacent a second semiconductor region of a second conductivity type and which is located between said first region and an anode region which is of said first conductivity type, said gate electrode being operative in use to cause said inversion layer to initiate carrier injection into said first and second regions thereby producing a thyristor action in which the inversion layer, while it is present, acts as an emitter thereof.

According to a second aspect of this invention, a semiconductor trench device includes an active region having one or more trenches extending from a first surface thereof with at least one p-n junction across which current flow is controllable by a field effect gate electrode disposed at a wall region of the trench and which electrode is operative to produce an inversion layer in an adjacent first p type region, at least a bottom portion of said trench remote from said first surface being positioned in said first p type region, said first p type region being adjacent an n type region which is located between said first p type region and an anode second p type region, said gate electrode being operative in use to form the inversion layer adjacent thereto in dependence on a potential applied thereto, thereby causing electron injection into said first p type region and said n type region and a thyristor action in which the inversion layer, while it is present, acts as an emitter thereof.

According to a third aspect of this invention, a semiconductor trench device includes an active region having one or more trenches extending from a first surface thereof with at least one p-n junction across which current flow is controllable by a field effect gate electrode disposed at a wall region of the trench and which electrode is operative to produce an inversion layer in an adjacent first p type region, at least a bottom portion of said trench remote from said first surface being positioned in said first p type region, said first p type region being adjacent a first n type region which is located between said first p type region and an anode second p type region, said gate electrode being operative in use to form the inversion layer adjacent thereto in dependence on a potential applied thereto, thereby causing electron injection into said first p type and said first n type region and current flow to said anode second p type region while, and only while, said inversion layer is maintained by the field effect of said gate electrode.

Preferably a further n type region which constitutes one side of said p-n junction forms part of the cathode of the device. Preferably the further n type region is of n+ conductivity type. Preferably said first n type region is of n– conductivity type.

In preferred embodiments of the invention, the trench cuts through the n+ cathode diffusion, and terminates inside said first p type region. When a positive potential is applied to the gate electrode, an inversion channel in the form of a layer immediately adjacent to the surface of the trench is produced, and this channel connects with the first n type region (termed an n– base region) located beyond the first p region. Thus, an electrical path is formed by a thin layer of electrons which joins the cathode second n type region and the n– base region. Electrons are injected into the n– base from the cathode, and as a result, holes are injected from the anode second p type region into the base. Consequently, diffusion of electrons from the inversion layer into the n– base takes place, so that the inversion layer acts as an emitter of a thyristor-like mechanism. As this inversion layer exists only while an appropriate potential is applied to the trench gate, it may be regarded as a virtual emitter, in that removal of the gate electrode causes the inversion layer to collapse and current conduction between anode and cathode to cease. The device therefore is inherently safe in that it can be turned on and off quickly and reliably.

Because the trench terminates in a p region, i.e. the bottom of the trench does not penetrate through the p region into the n– base region, the bottom of the trench is protected from the high electric field which exists while the device is turned off, i.e. while it is non-conductive. As the device is intended to operate at voltages in the range 400 volts to in excess of 5000 volts this is a very important consideration, and in fact permits devices of this invention to be safely and reliably used at high voltages.

BRIEF DESCRIPTION OF THE DRAWINGS

The invention is further described by way of example with reference to the accompanying drawings, in which.

DETAILED DESCRIPTION OF THE PREFERRED EMBODIMENTS

Figure 1:
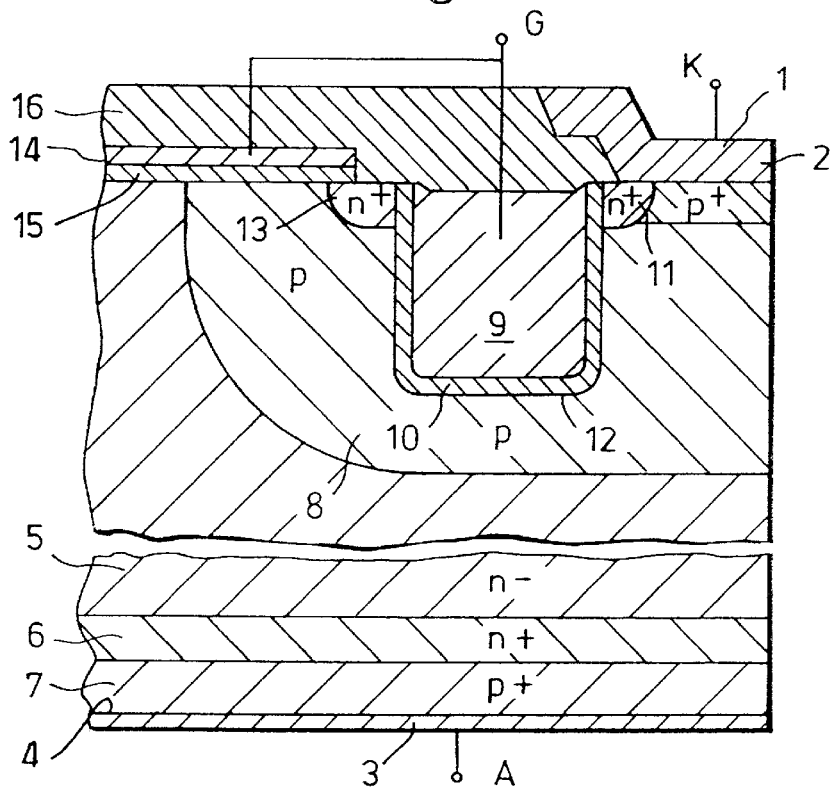
FIGS. 1 and 2 show sectional views of embodiments of the invention.
Figure 2:
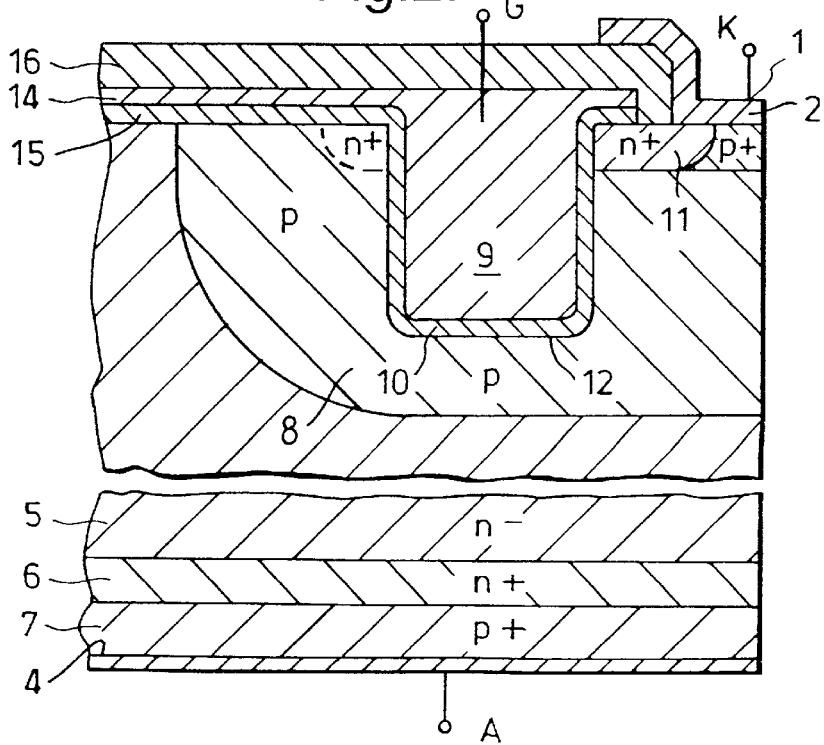

Referring to FIGS. 1 and 2, sectional views of part of a high power trench IGBT type semiconductor device are shown. A silicon body is provided with a cathode electrode 1 at a first surface 2 thereof and an anode electrode 3 at a second, opposite, surface 4 thereof. Typically the silicon body is formed from a flat relatively thin slice of silicon having an n− conductivity type, into which various conductivity modifying materials are introduced to form a succession of electrically different regions. Alternatively the silicon body is formed by the p anode region onto/into which the other regions are grown or diffused. In the drawing, the bulk of the device comprises the n− region 5, having relatively thin layers 6 and 7 of n+ and p+ material respectively between it and the anode electrode 3. The thin layer 6 is desirable but optional.

A region 8 of p type material in the form of a well is provided adjacent the first surface 2 to into which a trench 9 is formed. The trench 9 is a region of doped polysilicon which constitutes a gate electrode which has a thin outer oxide layer 10 positioned between it and the p region 8.

A small cathode n type region 11 is formed of n+ material at the first surface 2, so that a part of it is in contact with the oxide layer 10, and part in contact with the cathode electrode 1. Thus, one end of the p-n junction so formed between regions 8 and 11 is shorted out by the cathode electrode 1. This cathode region in operation constitutes part of the cathode of the device.

In FIG. 1 a further n+ region 13 is formed on the opposite side of the trench 9; this may be convenient from a manufacturing point of view. If it is provided, a separate connection is needed to a further gate electrode region 14 which overlies the junction between the n− base region 5 and the p region 8, and which extends to the n+ region 13. This gate region 14 is electrically connected to the gate electrode 9, and is spaced from the body of the semiconductor material by an oxide layer 15. A field oxide 16 overlies the surface 2.

In FIG. 2, the n+ region 13 may be omitted and the further gate electrode region 14 is electrically and physically continuous with the gate electrode 9.

The operation of the device is as follows. When a positive potential is applied to the gates 9 and 14 an inversion channel 12 is formed in the adjacent layer of p region 8. Therefore the n+ cathode is connected through the inversion channel to the n− region 5 (via the floating n+ region 13 in the case of FIG. 1). Thus an electrical path formed by a thin layer of electrons which joins the cathode 11 and the n− base 5 is established. Electrons are injected into the n− base from the cathode and as a result holes are injected from the anode p+ region 7 into the n− base 5. The buffer layer 6 reduces the hole injection from the p+ region 7 to increase the turn-off speed of the device. It is also used in the off-state to avoid punch-through. Due to the flow of holes through the p region 8 situated under the trench body 9, the potential in the p region 8 increases which further leads to the forward-biassing of the p region 8/n+ inversion layer 12 junction. As a result, diffusion of electrons from the inversion layer 12 into the n− base takes place, thereby skipping the long path adjacent to the further gate electrode 14. Once inversion layer injection mode is established, the effective channel length is significantly reduced and the conductivity modulation of the n− base is increased due to thyristor action. The thyristor structure with a dynamic emitter is formed between the n+ inversion layer 12/p region 8/n− base 5/and p+ anode 7. To facilitate this action, the concentration in the p region 8 is of the order of $10^{15}$ to $10^{16} cm^{-3}$, and the thickness of the region between the bottom of the trench 9 and the n− region 5 is of the order of 1 to 3 microns. The oxide 10 around the trench 9 may be only 500 Å thick.

During turn-off the inversion layer is removed and therefore the thyristor emitter 12 collapses. The device further turns-off like an IGBT. In the on-state, the device can be regarded as a combination between a thyristor and a Trench IGBT.

Figure 3:
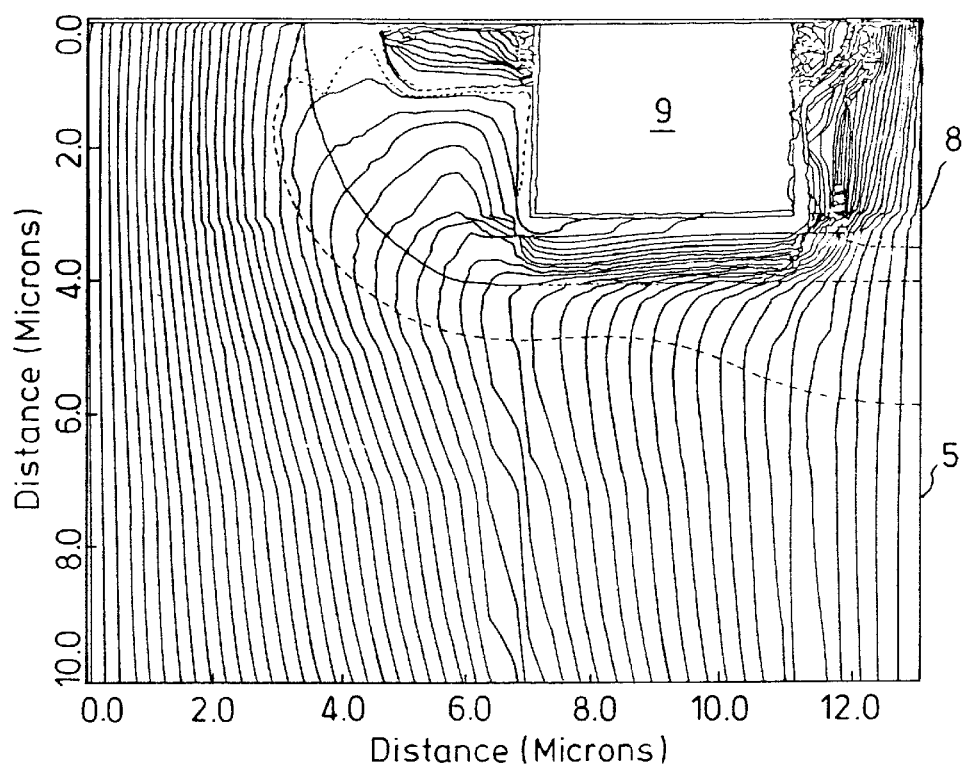
FIGS. 3, 4 and 5 are explanatory diagrams relating to the operation of those embodiments.
Figure 4:
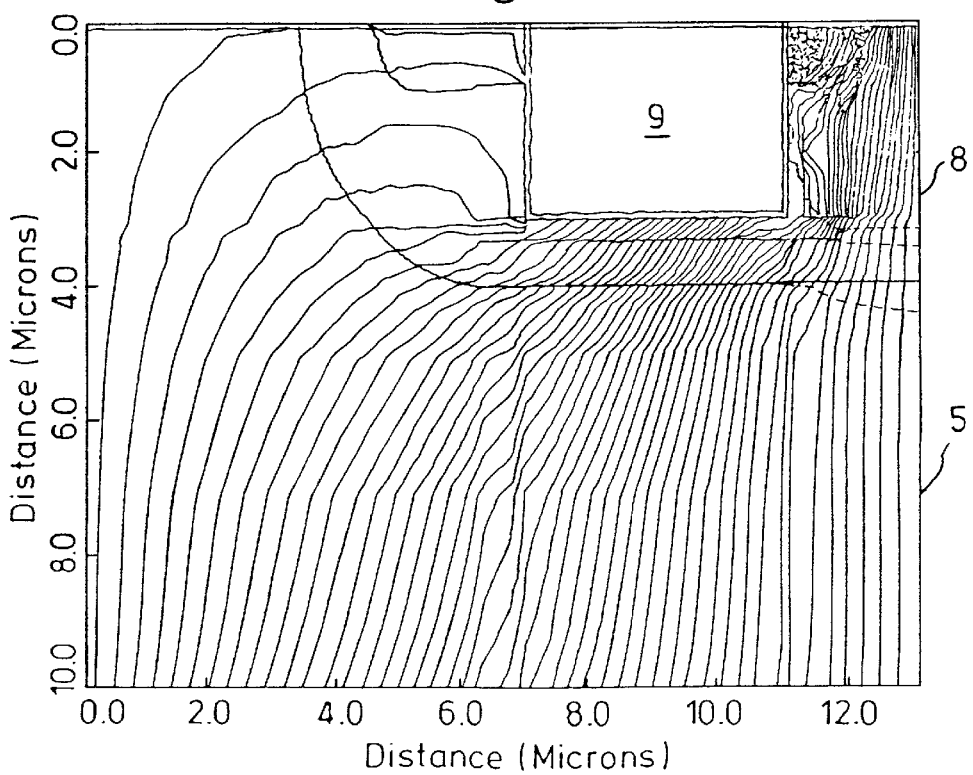

In FIG. 3 the transition from initial turn-on state where the electron current follows the long path through the two channels and n+ floating emitter is shown. The transition to the inversion layer injection mode shown in FIG. 4, in which the thyristor structure is active, can be clearly observed. In the off-state the trench body can be designed in such a way that at the maximum breakdown voltage, the depletion region does not fully reach the trench body. It is nevertheless important to mention that even in the case where the trench body touches the depletion region the breakdown voltage is not affected provided that the electric field developed at the trench corners is considerably lower than the peak of the electric field at the p region 8/n− base 5 junction.

Figure 5:
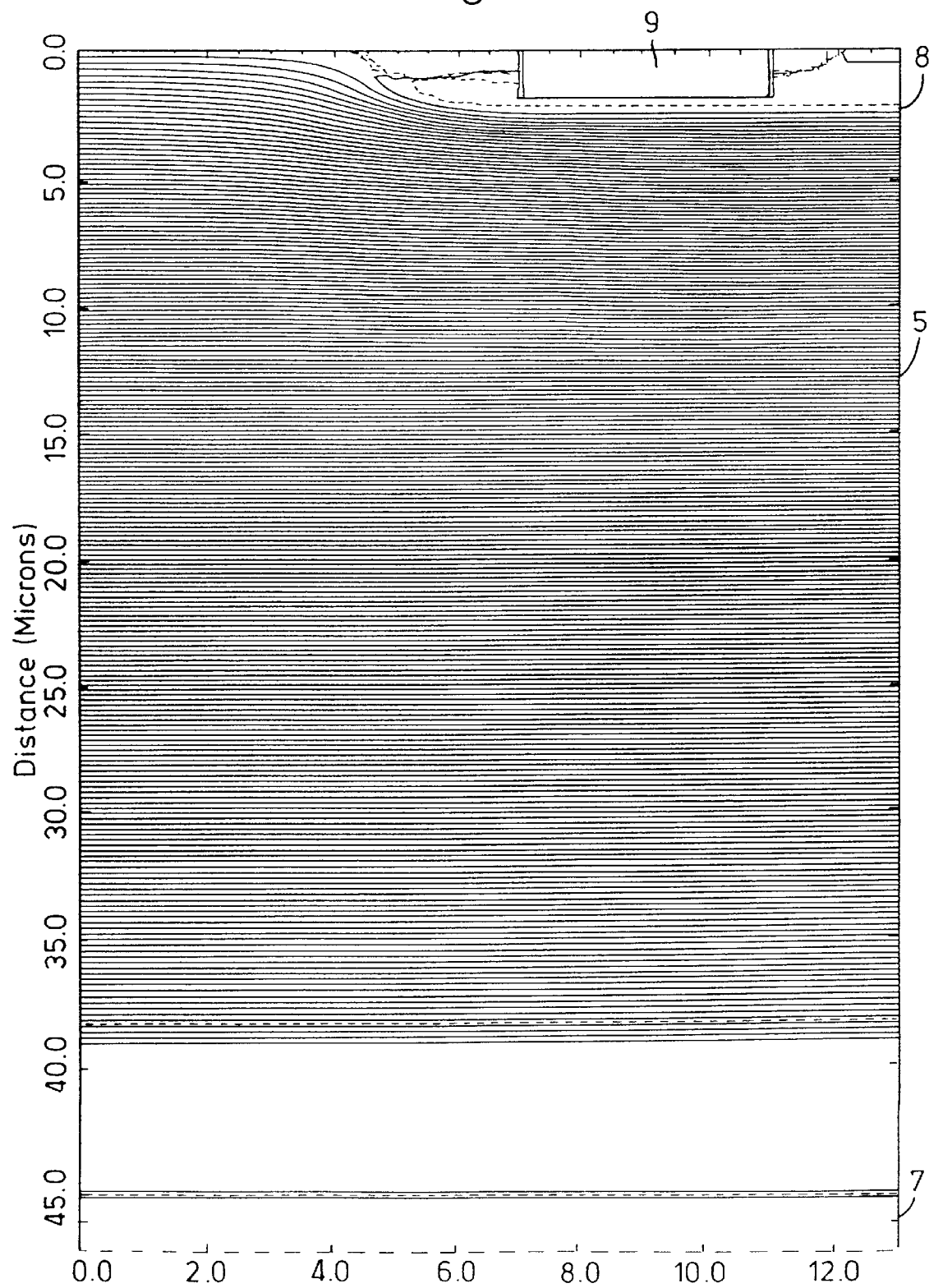

The importance of having the bottom of the trench well above the junction between the n− base region 5 and the p region 8 can be appreciated from FIG. 5, which illustrates the potential distribution during the off (i.e. non-conductive) state at the breakdown voltage of the device. As the trench is well protected inside the p− region, the depletion region of the underlying junction does not reach the trench bottom. Thus the breakdown voltage is determined by this junction and is not affected by the presence of the trench. The design of the p region 8, its doping concentration profile and the distance between the bottom of the p region and the bottom of the trench is a significant parameter in device operation. A small distance between the p region and the bottom of the trench can lead to premature breakdown whereas a large distance can compromise the turn-on of the thyristor structure.

Figure 6:
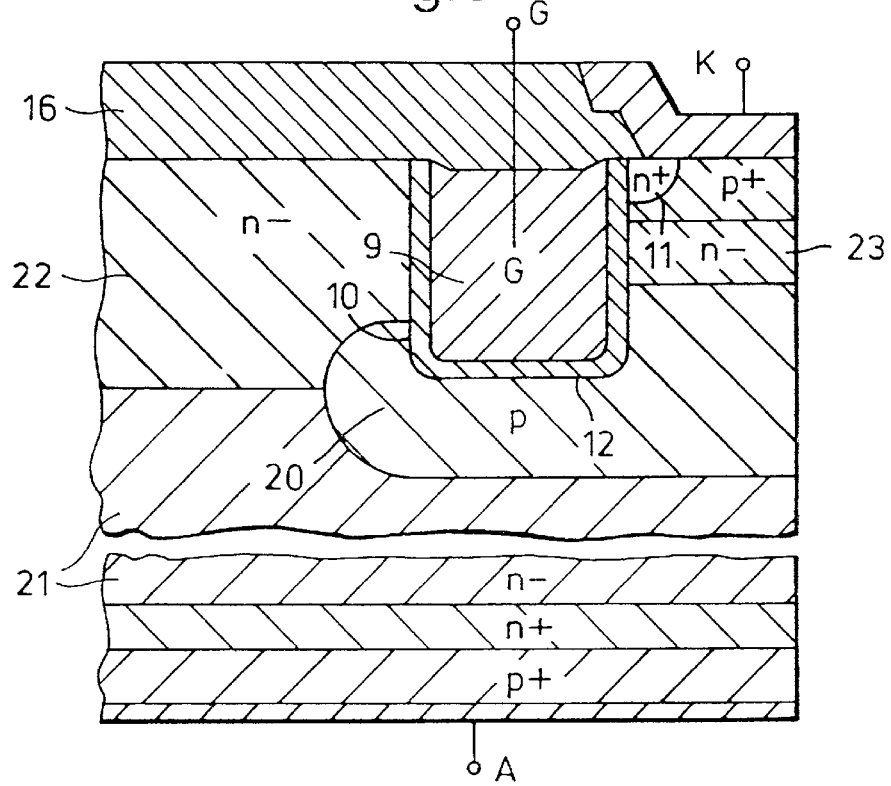
FIGS. 6, 7, 8, 9, 10 and 11 show modified embodiments.

A modified structure is shown in FIG. 6, in which a buried p region 20 is used. In manufacture, a selective implant of the p region 20 is made into the n− base region 21, subsequently followed by an epitaxial growth of the second part of the n− base 22.

The bottom of the trench penetrates the p+ buried layer 20. The trench corners are protected from high electric fields in the off-state by the presence of this p buried layer. Comparing with the structure of FIGS. 1 and 2 the fabrication process is more complex, however the device offers an improved protection against high electric fields in the off-state (because the p+ buried layer 20 can be more heavily doped than the bottom of the p region 8 of FIGS. 1 and 2. This eliminates the need for the n+ floating layer 13 and the further gate region 14 of FIG. 1.

The principle of operation is similar to that of FIGS. 1 and 2. When a positive potential is applied to the gate, electrons are injected from the cathode through the accumulation and inversion channels to the upper left-hand side region of the n− base 22. The hole current travelling to the cathode short contact through the p buried layer gives rise to a high potential in the p buried layer which forward-biases the inversion layer 12/p buried layer 20 junction. This is accompanied by high level injection of electrons from the inversion layer and therefore enhanced conductivity modulation of the upper n− base. The effective channel length is also reduced.

Figure 7:
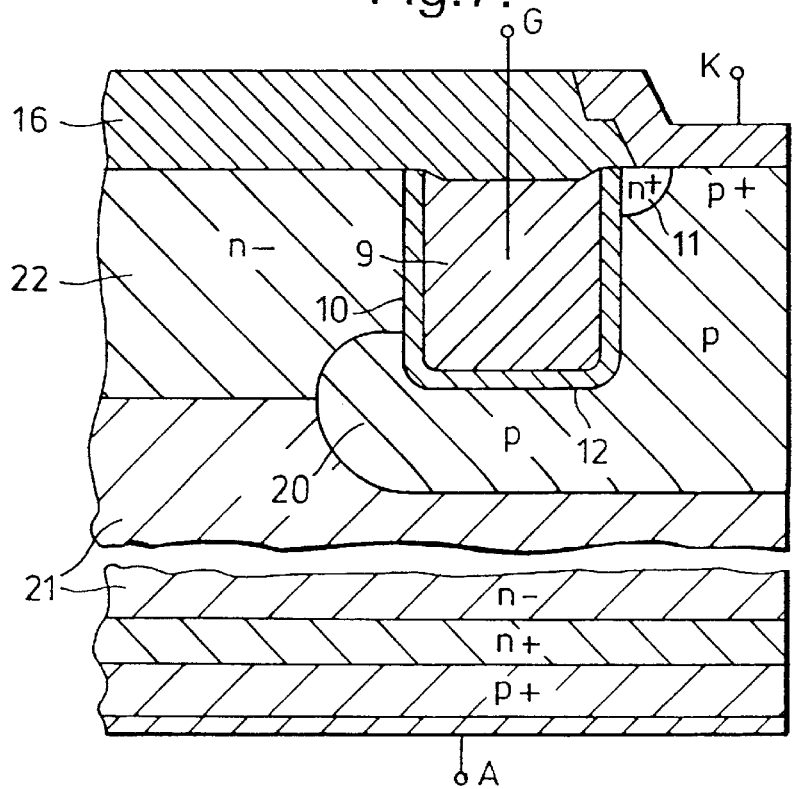

The n− region 23 can in practice be dispensed with, as shown in FIG. 7, in which the upper p+ diffusion reaches the buried p region 20.

Figure 8:
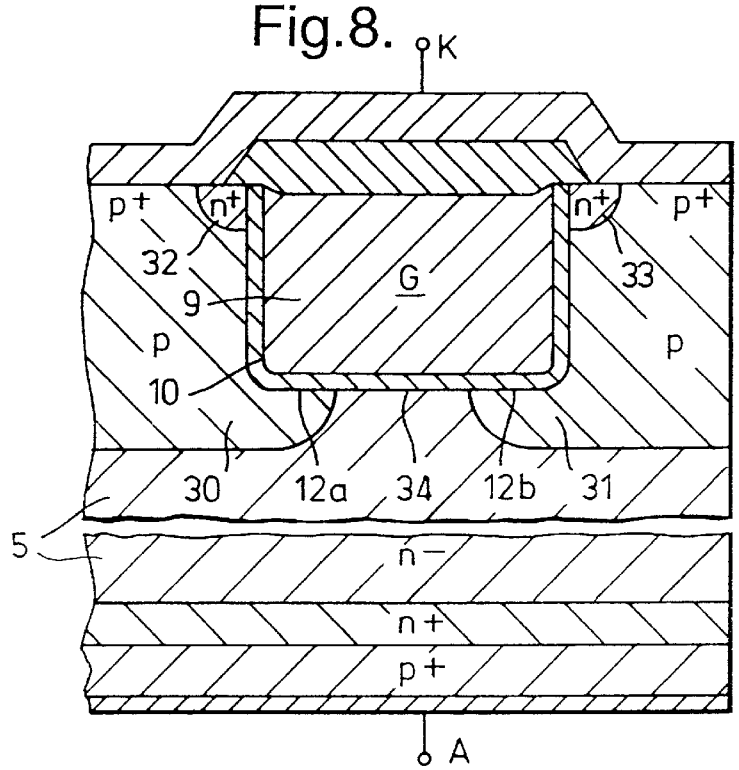

FIG. 8 shows a further embodiment in which the trench 9 is associated with two inversion layers.

The p regions 30, 31 on both sides of the trench cover the trench corners to protect them from high electric fields in the off-state. During turn-on an inversion channel is formed in both of the p regions. Electrons are injected from the cathodes 32, 33 through the n– upper region situated between the p regions. The PIN diode formed between the accumulation layer 34, the n– base 5 and p+ anode region 7 is active and in the initial stage the conduction area and the conductivity modulation process at the upper part of the n– base is restricted to the area between the p regions. The enhanced conductivity modulation in this region is due to the forward-biassed accumulation layer junction (n+ accumulation layer 34/n– base 5 junction). As the potential through the p regions 30, 31 increases above the potential in the inversion layers 12a, 12b respectively, the inversion layer 12a/p region 30 junction and the inversion layer 12b/p region 31 junction become forward-biassed and electrons are directly injected from the inversion layer through the p region into the n– base. Thus the conductivity modulation area extends significantly over the p regions 30, 31 and both the accumulation layer emitter 34 (as part of the PIN diode) and the inversion layer emitter 12a and 12b (as part of the thyristor) are active. When the gate potential is removed the accumulation layer and inversion layers collapse ensuring a fast and very efficient turn-off mechanism. It should be noted that this structure has a higher channel density than the previous structures since both sides of the gate have a cathode contact.

Figure 9:
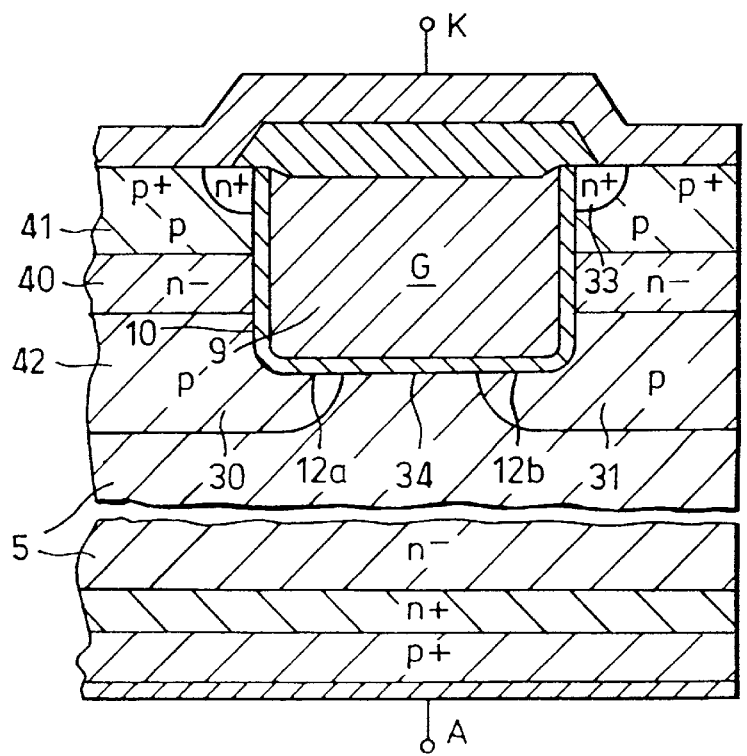

The device shown in FIG. 9 is operationally equivalent to that of FIG. 8, and differs in that an optional n– layer 40 is positioned to separate the p regions into upper and lower portions 41 and 42.

In practice, a high current device could have a plurality of trench structures operating in parallel.

Figure 10:
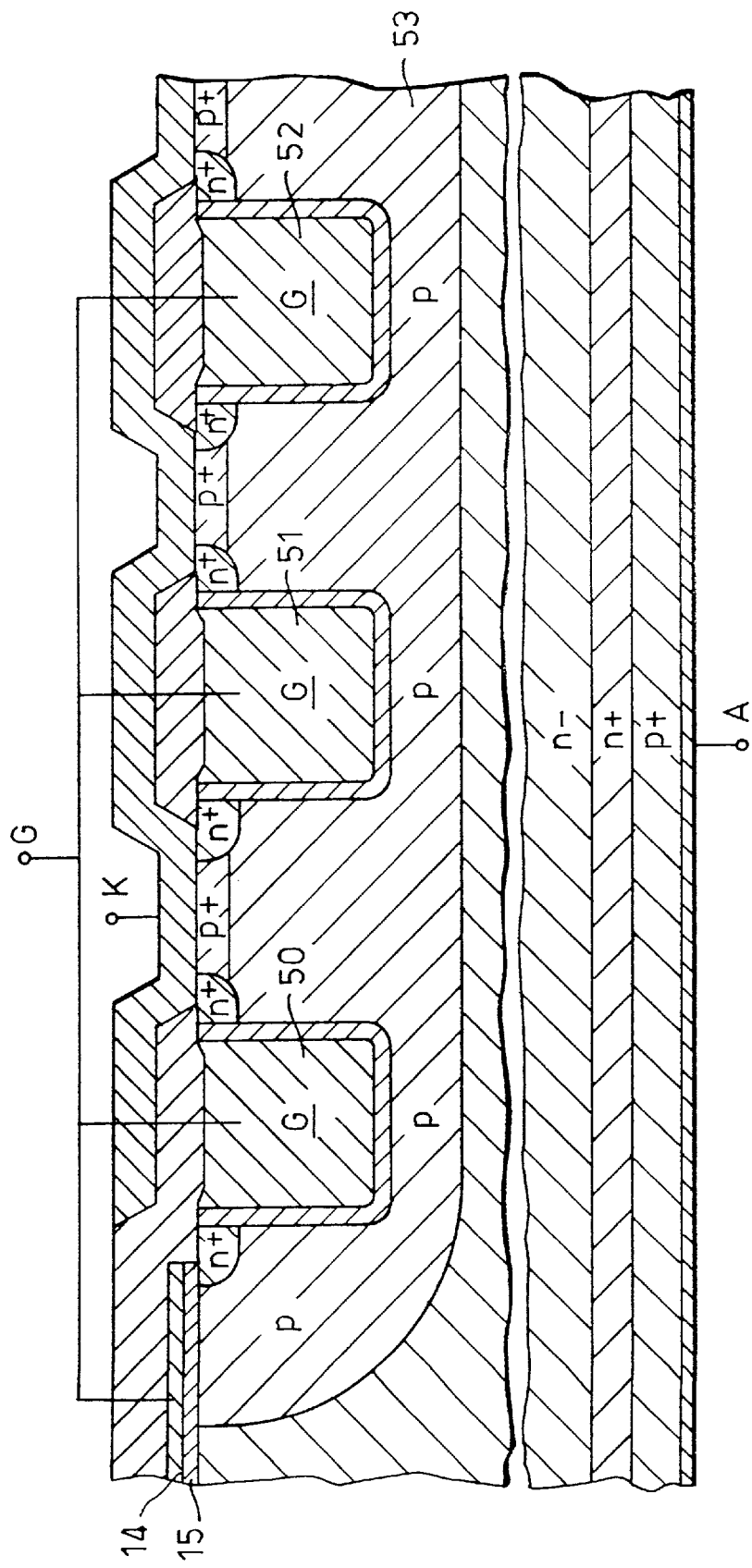

FIG. 10 shows an arrangement in which a number of trenches 50, 51, 52 are associated with a common p region 53 and a single lateral gate 14, 15.

While this results in an increased channel density the second and subsequent trenches (looking from the left-hand side) may not fully participate to the conduction, i.e. the inversion layer junctions associated with the second and subsequent trenches may not be fully forward-biassed.

Figure 11:
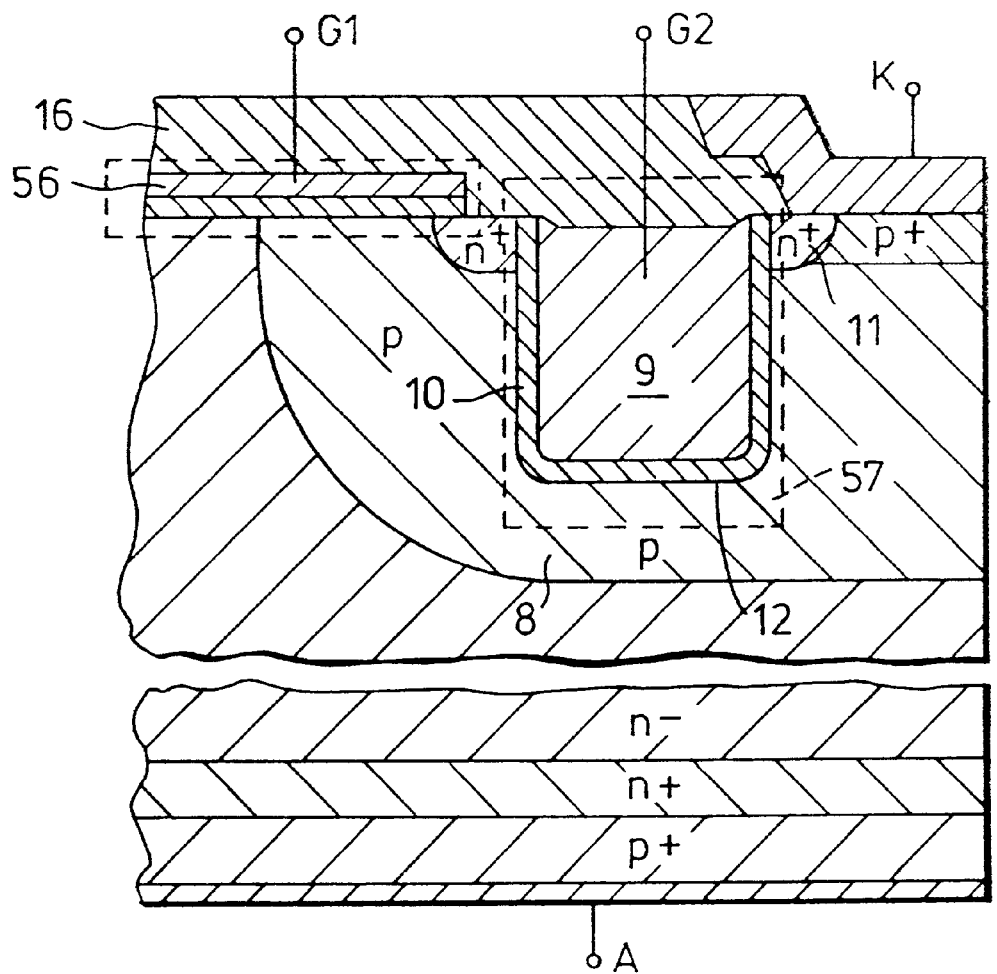

A double gate device is shown in FIG. 11. This device can offer an increased control and a larger safe operating area, but does require a more complex driving circuit to apply signals to the gates. The structure has two MOSFET gates termed the DMOS gate (G1) and the trench gate (G2) and associated MOSFET elements 56, 57. The device turns on by applying a positive potential on both G1 and G2. When G1 and G2 are active, the device can be designed to operate in a similar mode to the previously described devices. When consecutively G1 is switched off (the potential on G1 is a short positive square pulse), the device switches in the inversion layer injection mode. In this mode the thyristor structure which has the emitter formed by the inversion layer 12 associated with the trench gate is fully operational. The device turns off by removing the positive potential on G2 (G1 is already off). The inversion layer emitter is quickly removed and the turn-off continues with the process of charge sweeping to the cathode short contact and the relatively slow recombination of carriers at the anode side.

Figure 12:
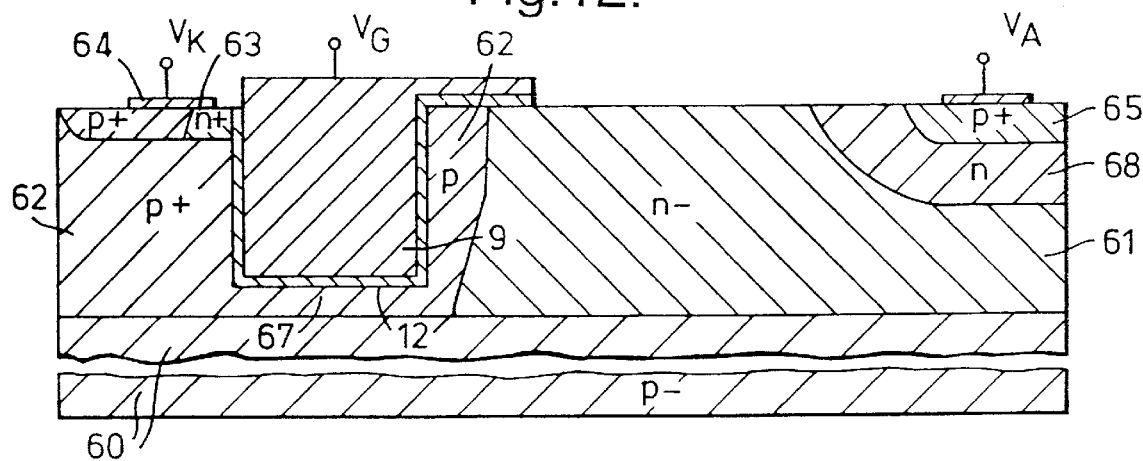
FIGS. 12, 13 and 14 show an alternative, lateral configuration of the invention.
Figure 13:
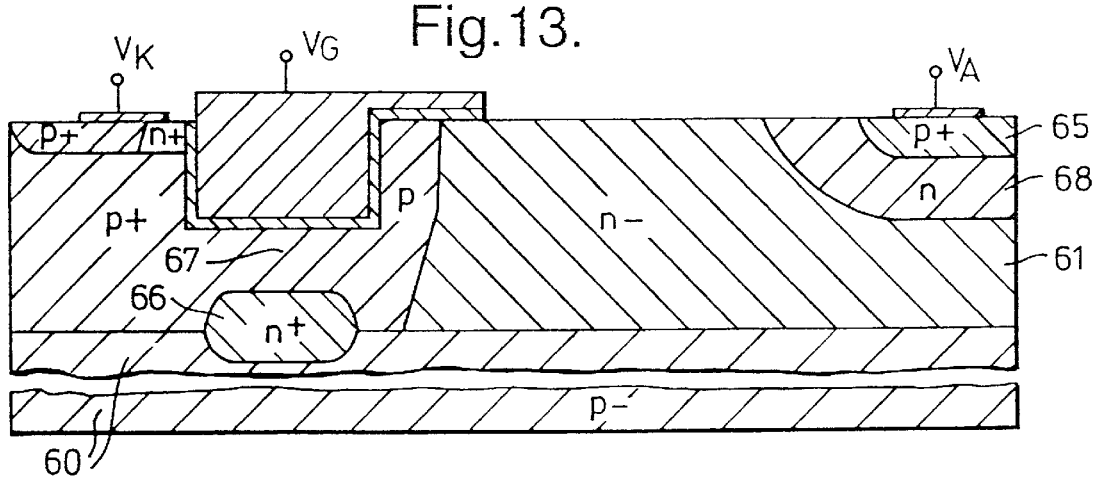
Figure 14:
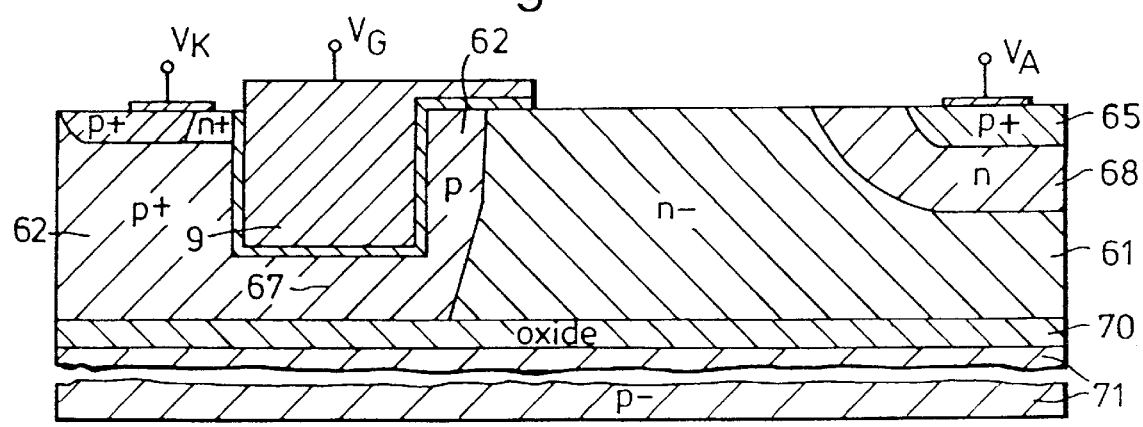

An alternative form of the invention is shown in FIG. 12, which is termed a lateral device. Variations of this configuration are shown in FIGS. 13 and 14. The body of the device can be thin, and if desired can be formed on an insulating substrate.

In FIG. 12, the device is formed on a p– substrate 60. An n– epitaxial layer 61 is grown onto the p– substrate 60. A p well 62 is formed onto the n– epitaxial layer 61 which connects the cathode 64 to the p– substrate 60. The gate trench 9 is located in the p region 62. As before the cathode connection is to a localized n+ region 63 having a p-n junction which is electrically shorted by the cathode electrode 64. The p+ anode 65 is located at the same major surface of the silicon body as the cathode, and thus the term lateral device is used. An n buffer layer 68 is desirable for punch-through protection in the off-state and also to increase the turn-off speed.

An n+ buried layer 66 (shown in FIG. 13) can be used to narrow the path between the channel and the p– substrate 60, to facilitate the triggering of the thyristor with the emitter formed by the inversion layer 12.

FIG. 14 depicts an insulating layer 70, in this case an oxide, overlying a silicon substrate 71, as known in the state of the art of Silicon on Insulator technology. Other Dielectric Isolation (DI) technologies such as Silicon on Sapphire (SOS) may also be used. The advantage of this structure is the absence of the current through the p– substrate which results in a more effective triggering of the inversion layer thyristor (the hole current at the cathode side is constricted to flow only between the oxide layer and the trench gate) and in addition eliminates the undesirable charge stored in the substrate.

The principle of operation of the lateral devices is similar to that of FIGS. 1 and 2. Once the anode junction is turned-on the hole current flowing under the trench gate through the narrow p path 67, forward-biases the inversion layer/p base junction and thus initiates the thyristor (n+ inversion layer 12/p base 62/n– base 61/p+ anode 65). The increased carrier concentration due to diffusion and recombination at the inversion layer emitter/p base junction leads to a substantially reduced voltage drop on the n– base at the cathode side. The effect is significant for low lifetime devices where the n– base voltage drop has the major contribution to the total voltage drop.

The recombination of holes with electrons in the inversion layer also leads to a reduced hole current reaching the cathode contact thus reducing the latch-up effect and improving the forward biassed safe operating area. The device also exhibits a high immunity against static and dynamic latch-up due to the use of the trench gate.

As before, the trench body is situated inside the relatively highly doped p region and therefore is protected against high electric fields in the blocking mode. In structures of the kind shown in FIGS. 12, 13 and 14, typically many trenches would be provided in a single device and as the trenches are far from each other, the problem of high electric fields at the bottom corners would be severe, but by using the inversion layer injection concept in such devices and therefore placing the trench body inside the p region this problem is largely overcome.

Based on similar considerations (i.e. location of the trench body inside the p region) an increase in the trench gate width does not affect the breakdown performance but results in superior on-state characteristics. The device has only three terminals, easy gate control, reduced latch-up effect, wide safe operating area and enhanced geometrical carrier distribution at the cathode side approaching that of a thyristor.

Figure 15:
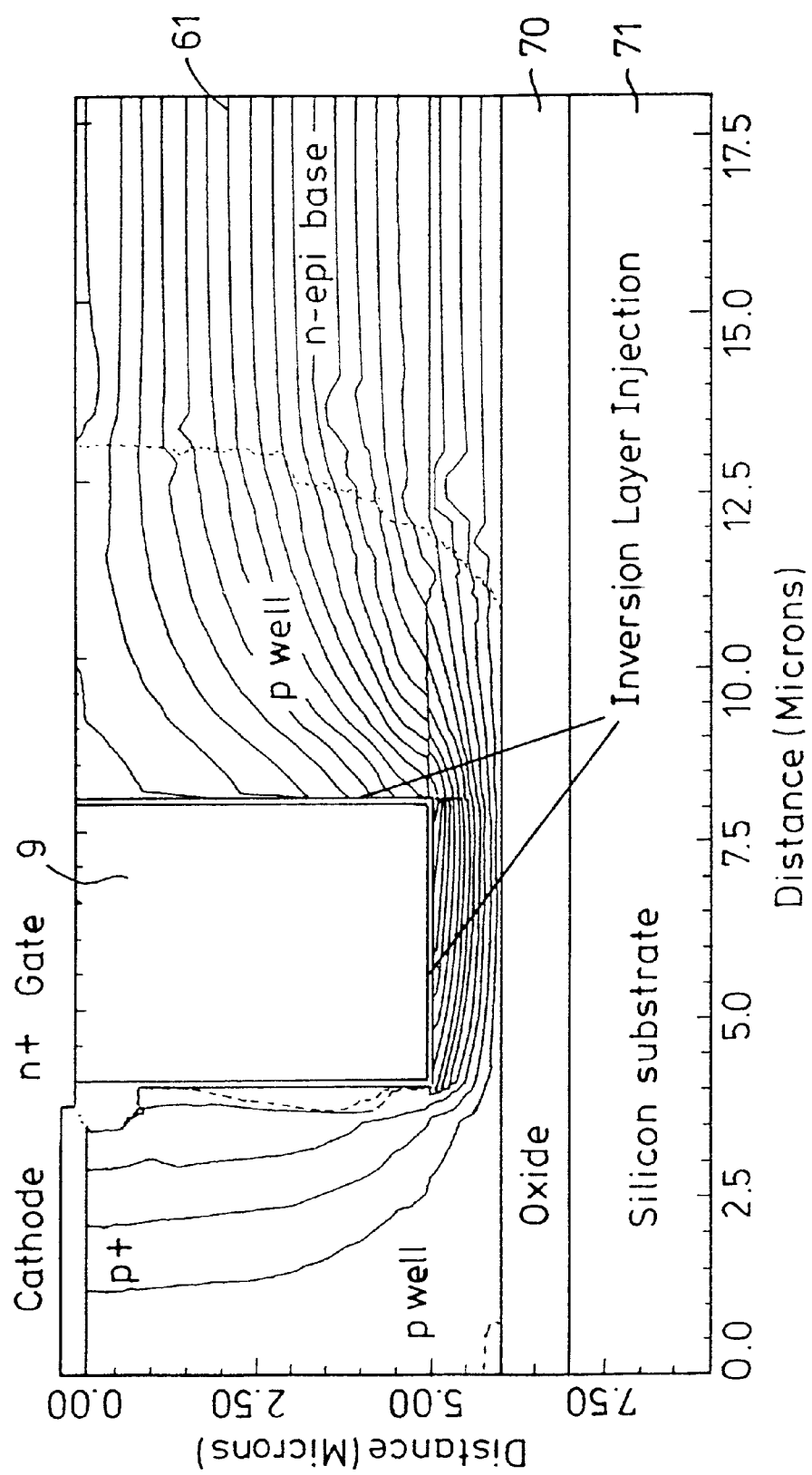
FIG. 15 is an explanatory diagram relating thereto.

Based on a simulation of the device shown in FIG. 14, results shown in FIG. 15 have been obtained. This illustrates current flow lines in the inversion layer injection mode in the region of the trench gate.

Due to the use of SOI (Silicon on Insulator) technology which results in no excess charge stored in the substrate, the turn-off speed of the device is very high.

Figure 16:
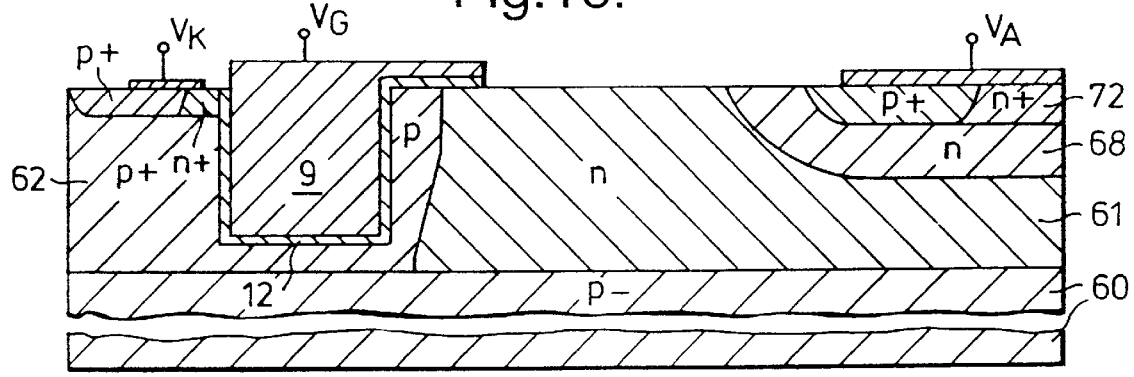
FIGS. 16, 17 and 18 show modified embodiments of the lateral configuration.
Figure 17:
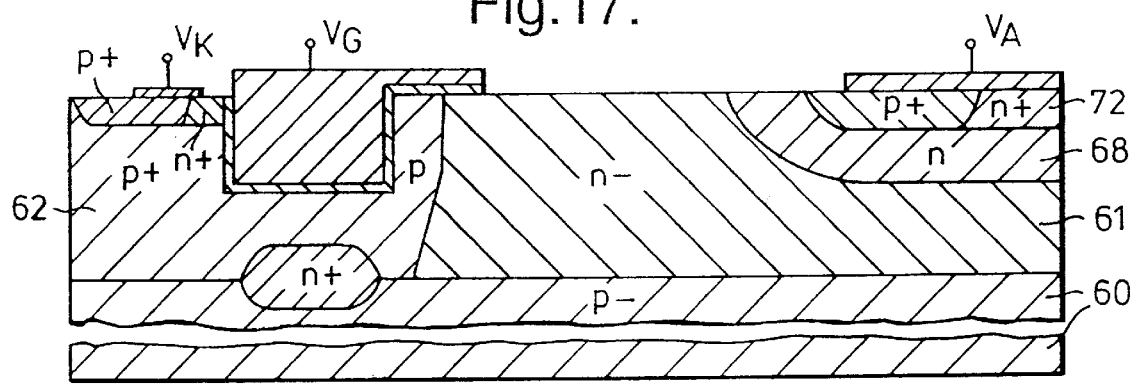
Figure 18:
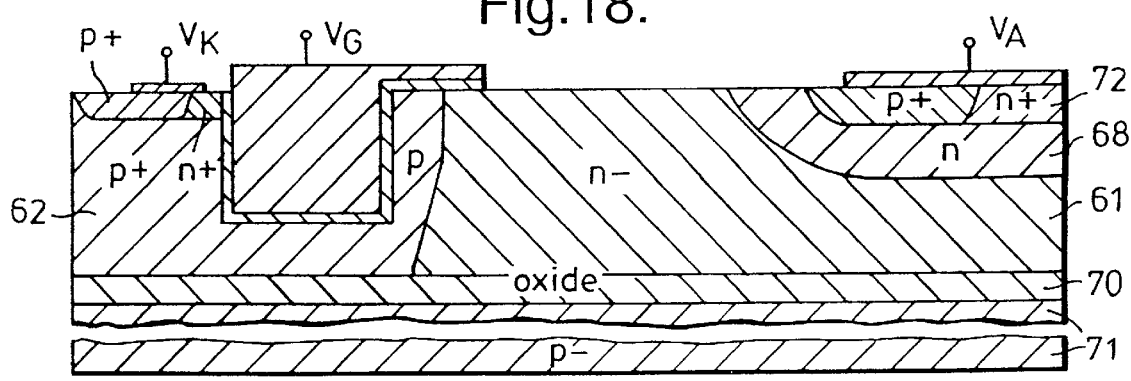

Further modifications of the lateral structure are shown in FIGS. 16, 17 and 18 in which the anode is provided with an additional n+ surface region 72 such that the p-n junction formed between it and the p+ anode is electrically shorted by the anode electrode. This reduces the injection at the anode side and therefore leads to a higher on-state voltage drop. The reduction in the anode injection efficiency and the collection of electron charge during turn-off results however in very fast turn-off.

What is claimed is:

1. A semiconductor trench device, comprising: an active region having at least one trench extending from a first surface thereof with at least one p-n junction across which current flow is controllable by a field effect gate electrode disposed at a wall region of said at least one trench, said gate electrode being operative to produce an inversion layer in a first semiconductor region of a first conductivity type, at least a bottom portion of said at least one trench remote from said first surface being positioned in said first semiconductor region, said first region being adjacent a second semiconductor region of a second conductivity type, said second region being located between said first region and an anode region which is of said first conductivity type, said gate electrode being operative, in use, to cause said inversion layer to initiate carrier injection into said first and second regions, thereby producing a thyristor action in which the inversion layer, while it is present, acts as an emitter thereof.

2. A semiconductor trench device, comprising: an active region having at least one trench extending from a first surface thereof with at least one p-n junction across which current flow is controllable by a field effect gate electrode disposed at a wall region of said at least one trench, said gate electrode being operative to produce an inversion layer in an adjacent first p-type region, at least a bottom portion of said at least one trench remote from said first surface being positioned in said first p-type region, said first p-type region being adjacent an n-type region which is located between said first p-type region and an anode second p-type region, said gate electrode being operative, in use, to form the inversion layer adjacent thereto in dependence on a potential applied thereto, thereby causing electron injection into said first p-type region and said n-type region and a thyristor action in which the inversion layer, while it is present, acts as an emitter thereof.

3. A semiconductor trench device, comprising: an active region having at least one trench extending from a first surface thereof with at least one p-n junction across which current flow is controllable by a field effect gate electrode disposed at a wall region of said at least one trench, said gate electrode being operative to produce an inversion layer in an adjacent first p-type region, at least a bottom portion of said at least one trench remote from said first surface being positioned in said first p-type region, said first p-type region being adjacent a first n-type region which is located between said first p-type region and an anode second p-type region, said gate electrode being operative, in use, to form the inversion layer adjacent thereto in dependence on a potential applied thereto, thereby causing electron injection into said first p-type and said first n-type regions and current flow to said anode second p-type region while, and only while, said inversion layer is maintained by a field effect of said gate electrode.

4. The device as claimed in claim 3, wherein said first p-type region incorporates a cathode second n-type region which is shorted to the first p-type region by a cathode electrode of the device.

5. The device as claimed in claim 4, wherein a further field effect gate electrode element is provided to produce a continuous inversion channel under the control of a gate potential, said channel extending from the cathode second n-type region to said first n-type region during a current turn-on phase of the device.

6. The device as claimed in claim 5, wherein said further gate electrode is positioned at said first surface.

7. The device as claimed in claim 5, wherein said further gate electrode element is electrically and physically continuous with said field effect gate electrode.

8. The device as claimed in claim 5, wherein said further gate electrode element is physically separate from said field effect gate electrode.

9. The device as claimed in claim 4, wherein said first p-type region is buried, in that an interface between said first p-type region and said cathode second n-type region is below said first surface.

10. The device as claimed in claim 4, wherein a cross-section of said at least one trench is substantially rectangular, and two bottom corners thereof remote from said first surface are located in said first p-type region.

11. The device as claimed in claim 4, wherein said cathode second n-type region abuts a bottom wall region of said at least one trench, and wherein wall portions of said at least one trench on both sides of said bottom region are positioned in p-type regions of material.

12. The device as claimed in claim 11, wherein said wall portions constitute the respective bottom corners of said at least one trench.

13. The device as claimed in claim 8, wherein said first gate electrode and said further gate electrode element are electrically separate, whereby individual gate signals are applied to each.

14. The device as claimed in claim 4, wherein said anode second p-type region is located at said first surface, whereby current flows laterally through the device between an anode and a cathode of the device.

15. The device as claimed in claim 14, wherein said anode second p-type region and said cathode second n-type region are formed upon a common insulating surface.

16. The device as claimed in claim 4, wherein said n-type regions are of n-conductivity type material.

17. The device as claimed in claim 1, wherein a cross-section of said at least one trench is substantially rectangular, and two corners thereof remote from said first surface are located in said first semiconductor region.

18. The device as claimed in claim 2, wherein a cross-section of said one trench is substantially rectangular, and two corners thereof remote from said first surface are located in said first p-type region.

19. The device as claimed in claim 1, wherein said first semiconductor region has a concentration of at least $10^{15}$ cm$^{-3}$.

20. The device as claimed in claim 19, wherein the concentration in said first semiconductor region is of the order of $10^{15}$ to $10^{16}$ cm$^{-3}$, and wherein said first semiconductor region has a thickness between the bottom of said at least one trench and said second semiconductor region of the order of 1 to 3 microns.

21. The device as claimed in claim 2, wherein said first p-type region has a concentration of at least $10^{15}$ cm$^{-3}$.

22. The device as claimed in claim 21, wherein the concentration in said first p-type region is of the order of $10^{15}$ to $10^{16}$ cm$^{-3}$, and wherein said first p-type region has a thickness between the bottom of said at least one trench and said n-type region of the order of 1 to 3 microns.

23. The device as claimed in claim 3, wherein said first p-type region has a concentration of at least $10^{15}$ cm$^{-3}$.

24. The device as claimed in claim 23, wherein the concentration in said first p-type region is of the order of $10^{15}$ to $10^{16}$ cm$^{-3}$, and wherein said first p-type region has a thickness between the bottom of said at least one trench and said first n-type region of the order of 1 to 3 microns.

* * * * *